(12) United States Patent
Zhang et al.

(10) Patent No.: US 11,335,741 B2
(45) Date of Patent: May 17, 2022

(54) DISPLAY PANEL AND DISPLAY DEVICE

(71) Applicant: WuHan TianMa Micro-Electronics Co., Ltd., Wuhan (CN)

(72) Inventors: Guofeng Zhang, Wuhan (CN); Junqiang Wang, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 16/853,698

(22) Filed: Apr. 20, 2020

(65) Prior Publication Data
US 2020/0251538 A1   Aug. 6, 2020

(30) Foreign Application Priority Data
Oct. 31, 2019 (CN) .......................... 201911052750.2

(51) Int. Cl.
*H01L 27/32* (2006.01)
*G02F 1/01* (2006.01)
*H01L 51/52* (2006.01)

(52) U.S. Cl.
CPC ........ *H01L 27/3232* (2013.01); *G02F 1/0126* (2013.01); *H01L 27/3234* (2013.01); *H01L 27/3244* (2013.01); *H01L 51/5215* (2013.01); *G02F 2202/14* (2013.01); *H01L 2251/5369* (2013.01)

(58) Field of Classification Search
CPC . H01L 51/5206; H01L 51/5218; G02F 1/155; G02F 2202/14; G02F 1/0126
See application file for complete search history.

(56) References Cited

U.S. PATENT DOCUMENTS

| | | | | |
|---|---|---|---|---|
| 2003/0224219 A1* | 12/2003 | Nakazawa | ............... | C09K 9/00 428/701 |
| 2011/0133672 A1* | 6/2011 | Tsang | ..................... | F21S 10/02 315/294 |
| 2015/0165420 A1* | 6/2015 | Zhao | ........................ | C02F 1/30 422/186.3 |
| 2016/0233275 A1* | 8/2016 | Toyoda | ............... | H01L 51/0073 |
| 2018/0196303 A1* | 7/2018 | Jiang | ................. | G02F 1/133512 |
| 2020/0111259 A1* | 4/2020 | Sears | ..................... | G06F 3/012 |
| 2020/0312832 A1* | 10/2020 | Chi | ..................... | H01L 27/3276 |

FOREIGN PATENT DOCUMENTS

| | | |
|---|---|---|
| CN | 105702705 A | 6/2016 |
| CN | 208819534 A | 6/2016 |
| CN | 208819534 U | 5/2019 |

\* cited by examiner

*Primary Examiner* — Eric K Ashbahian
(74) *Attorney, Agent, or Firm* — Kilpatrick Townsend & Stockton, LLP

(57) ABSTRACT

Provided are a display panel and display device. The display panel includes a first display region and a second display region adjacent to the first display region. The second display region includes multiple first light-emitting elements, the first light-emitting element includes a first electrode, a second electrode and a light-emitting layer located between the first electrode and the second electrode, a direction from the light-emitting layer to the first electrode is a light exit direction of the display panel, the second electrode includes a photochromic layer, the photochromic layer includes a photochromic material, the second electrode includes a first state and a second state, and a light transmittance of the second electrode in the first state is greater than a light transmittance of the second electrode in the second state.

13 Claims, 7 Drawing Sheets

DISPLAY PANEL AND DISPLAY DEVICE

CROSS-REFERENCE TO RELATED APPLICATION

This application claims priority to Chinese patent application No. CN201911052750.2 filed with the Patent Office of the People's Republic of China on Oct. 31, 2019, the disclosure of which is incorporated herein by reference in its entirety.

FIELD

The present disclosure relates to a display technology and, in particular, to a display panel and a display device.

BACKGROUND

Organic Light-Emitting Diode (OLED) components have the advantages of simple structure, self-emission, high contrast, high response speed and low power consumption. The OLED components have been widely used in display fields such as mobile phones, tablets and televisions. With the development of mobile phones and other consumer electronics products including display panels and cameras, a full screen with high screen-to-body ratio is becoming more and more popular. The so-called screen-to-body ratio is the ratio of the screen area to the entire machine area, and a higher screen-to-body ratio can bring a better visual experience to users.

Taking mobile phones as an example, in order to achieve a higher screen-to-body ratio, a non-display region is generally designed on the top of the screen in the related art. For example, designs such as "bangs screen" and "water drop screen" that are widely used now can increase the screen-to-body ratio to a certain extent, but the aesthetics of mobile phones are affected, and it is difficult to achieve the effect of true full screen display.

SUMMARY

Embodiments of the present disclosure provide a display panel and a display device. The display panel can realize normal display in the region where a light sensing element is arranged under the screen, increase the screen-to-body ratio of the display panel, and ensure that the light sensing element can receive a sufficient amount of light when the second display region of the display panel is provided with the light sensing element on a side facing away from a light-emitting surface of the second display region, and the beneficial effect of improving performance of the display panel is achieved.

One embodiment of the present disclosure provides a display panel including a first display region and a second display region adjacent to the first display region.

The second display region includes multiple first light-emitting elements, and the first light-emitting element comprises a first electrode, a second electrode, and a light-emitting layer located between the first electrode and the second electrode.

A direction from the light-emitting layer to the first electrode is a light exit direction of the display panel, the second electrode includes a photochromic layer, and the photochromic layer includes a photochromic material.

The second electrode includes a first state and a second state, and a light transmittance of the second electrode in the first state is greater than a light transmittance of the second electrode in the second state.

Another embodiment of the present disclosure further provides a display device including any one display panel described above and a light sensing element.

The light sensing element is disposed in the second display region of the display panel and is located on a side of the second electrode facing away from a light exit surface of the display panel, and a light sensing surface of the light sensing element faces towards the display panel.

The display panel provided by the embodiments of the present disclosure includes the first display region and the second display region adjacent to the first display region. The second display region is a region in which a light sensing element is arranged, multiple first light-emitting elements are provided in the second display region, the first light-emitting element includes a first electrode, a second electrode and a light-emitting layer located between the first electrode and the second electrode, the second electrode includes a first state and a second state, a light transmittance of the second electrode in the first state is greater than a light transmittance of the second electrode in the second state, and normal display of the second display region can be achieved when the second electrode is in the second state. A direction from the light-emitting layer to the first electrode is a light exit direction of the display panel, a photochromic layer is provided in the second electrode, and the photochromic layer may switch between a transparent state and an opaque state to change the light transmittance of the second electrode. In the opaque state, the light sensing element (such as a camera) may be set to be invisible to achieve a full screen effect; the light sensing element may also be in a transparent state to ensure the normal operation of the light sensing element. When the light sensing element is turned on, the second electrode is in the first state, to facilitate external light to pass through the display panel and then received by the light sensing element to improve the imaging quality; when the light sensing element is turned off, the second electrode is in the second state, and the second electrode is a reflective electrode, to improve the light exit efficiency of the first light-emitting element and realizes a full screen display.

DETAILED DESCRIPTION

Figure 1:
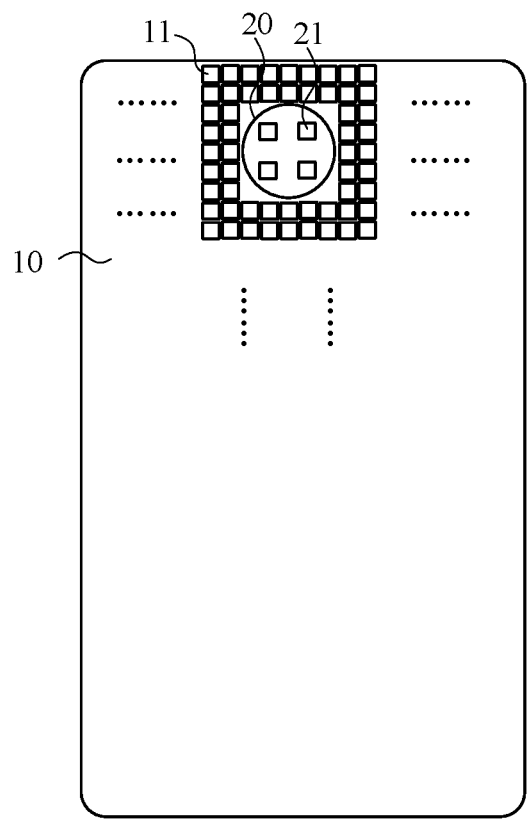
FIG. 1 is a schematic structural diagram of a display panel according to an embodiment of the present disclosure.

Hereinafter the present disclosure will be further described in detail in conjunction with the drawings and embodiments. It may be understood that the specific embodiments set forth below are intended to illustrate and not to limit the present disclosure. Additionally, it is to be noted that, for convenience of description, only part, not all, of the structures related to the present disclosure are illustrated in the drawings.

Terms used in the embodiments of the present disclosure are only used to describe specific embodiments and not intended to limit the present disclosure. It is to be noted that spatially related terms, including "on", "below", "left" and "right" used in the embodiments of the present disclosure, are described from the perspective of the drawings, and are not to be construed to limit the present disclosure. In addition, in the context, it will be understood that when a component is formed "on" or "below" another component, it may not only be directly formed "on" or "below" another component, and may also be indirectly formed "on" or "below" another component via an intermediate component. Terms like "first" and "second" are for description only and do not denote any order, quantity, or importance, but rather are used to distinguish different constituent parts.

Figure 2:
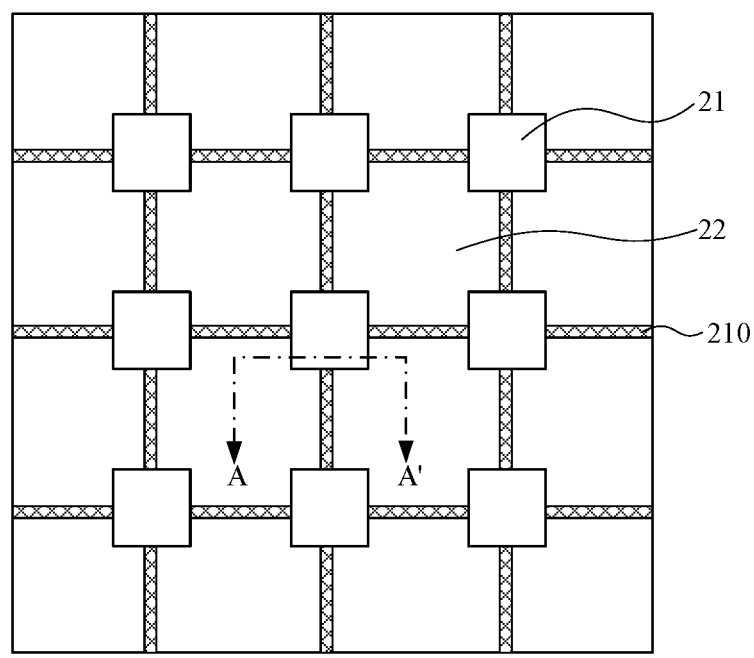
FIG. 2 is a partial schematic structural diagram of a second display region of a display panel according to an embodiment of the present disclosure.
Figure 3:
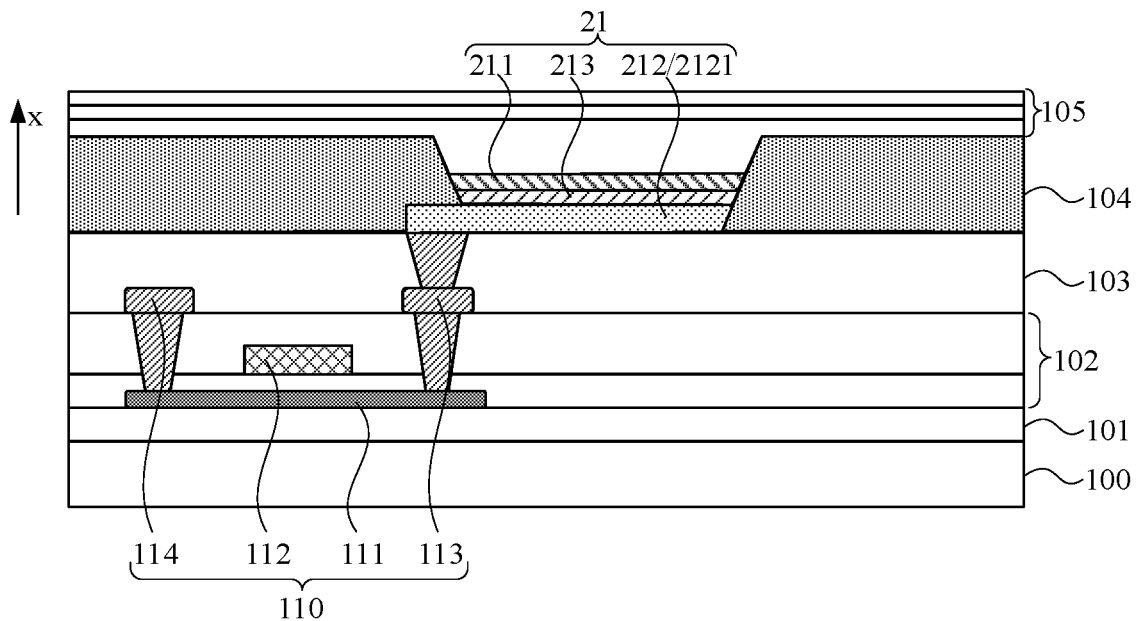
FIG. 3 is a schematic cross-sectional view taken along a line A-A' in FIG. 2.

FIG. 1 is a schematic structural diagram of a display panel according to an embodiment of the present disclosure; FIG. 2 is a partial schematic structural diagram of a second display region of a display panel according to an embodiment of the present disclosure; and FIG. 3 is a schematic cross-sectional view taken along a line A-A' in FIG. 2. Referring to FIGS. 1 and 2, the display panel provided by an embodiment of the present disclosure includes a first display region 10 and a second display region 20 adjacent to the first display region 10. The second display region 20 includes multiple first light-emitting elements 21, the first light-emitting element 21 includes a first electrode 211, a second electrode 212 and a light-emitting layer 213 located between the first electrode 211 and the second electrode 212, a direction x from the light-emitting layer 213 to the first electrode 211 is a light exit direction of the display panel, the second electrode 212 includes a photochromic layer 2121, the photochromic layer 2121 includes a photochromic material, the second electrode 212 includes a first state and a second state, and a light transmittance of the second electrode 212 in the first state is greater than a light transmittance of the second electrode 212 in the second state.

It may be understood that the display panel provided in the embodiment of the present disclosure is suitable for a display device needing a light sensing element to be disposed under a screen, where the light sensing element may be a camera. The following description uses the light sensing element is the camera as an example for description. Due to the high requirements of the camera on light, a hollowed region is generally formed at an edge or inside of the display region in the related art, but the hollowed region cannot display, so it is difficult to achieve a real full screen design. Since an aperture for the camera to receive light is generally set to be circular, the second display region 20 is exemplarily a circular region as shown in FIG. 1.

In a specific implementation process, the second display region 20 may be one or more. In addition, the second display region 20 may be a continuous region, or the second display region 20 may also be a discontinuous region, which may be designed and determined according to an actual application environment, which is not limited herein. In some implementation processes, the relative positional relationship between the first display region 10 and the second display region 20 may be that at least part of the edge of the second display region 20 and at least part of the edge of the first display region 10 coincide, and the rest of the second display region 20 is surrounded by the first display region 10. In this way, the second display region 20 is disposed on the edge of the display region of the display panel. In other implementation processes, the relative positional relationship between the first display region 10 and the second display region 20 may also be that the first display region 10 surrounds the second display region 20, so that the second display region 20 is disposed inside the display region of the display panel, as shown in FIG. 1. For example, the second display region 20 may be disposed at the upper left corner of the first display region 10. For another example, the second display region 20 may be disposed at the upper right corner of the first display region 10. For another example, the second display region 20 may be disposed on the left side of the first display region 10. For another example, the second display region 20 may be disposed on the left side of the first display region 10. Of course, in practical applications, the specific position of the second display region 20 may be designed and determined according to the actual application environment, which is not limited herein.

In a specific implementation process, the shape of the second display region 20 may be set to a regular shape, such as a rectangle, and the vertex angles of the rectangle may be right angles, or the vertex angles of the rectangle may also be arc-shaped angles. For another example, the shape of the first display region 20 may also be set as a trapezoid, and the trapezoid may be a forward trapezoid or an inverted trapezoid. In addition, the vertex angles of the trapezoid may be regular angles or arc-shaped angles. For another example, the shape of the second display region 20 may also be set to an irregular shape. For example, the shape of the second display region 20 may be set as a drop shape. Of course, in practical applications, the shape of the second display region 20 may be designed according to the shape of the elements provided in the second display region 20, which is not limited herein.

In a specific implementation process, the area of the second display region 20 is smaller than the area of the first display region 20. Of course, in practical applications, the design may be performed according to the elements provided in the second display region 20, which is not limited herein.

In an embodiment of the present disclosure, the relative positional relationship and shape of the first display region 10 and the second display region 20 are not limited, and may be specifically set according to the screen design of the display device. Taking a mobile phone as an example, the second display region 20 may be disposed at the upper left corner of the display region, or the second display region 20 may be disposed at the upper right corner of the display region. With the camera disposed at the corner, the second display region 20 may be used to perform simple and quick functions such as time, weather, and information reminders.

Referring to FIG. 2, the second display region includes multiple first light-emitting elements 21, and the first light-emitting element 21 may be an OLED for realizing normal display of the second display region. In order to meet the imaging requirements of the camera, the second display region 20 is also provided with multiple transparent regions 22, and each OLED needs to be driven by a driving circuit (not shown in FIG. 2) to emit light and needs multiple traces 210 for signal transmission. The four adjacent first light-emitting elements 21 and the traces 210 of the four adjacent first light-emitting elements 21 surround a transparent region 22, and the transparent region 22 is used for passing external light for camera imaging. It may be understood that when the camera is used to capture images, the display function of the second display region may be turned off to reduce the brightness of the ambient light around the camera during shooting and improve the shooting effect. In other embodiments, for example, when the ambient light intensity is sufficiently bright, the display function of the second display region may also be turned on during shooting, and the second display region may be in a display state or an off state when the camera is operating, which is not limited in an embodiment of the present disclosure.

Exemplary, referring to FIG. 3, the display panel provided in the embodiment may be an organic light-emitting display panel. The display panel includes a base substrate 100, a thin film transistor 110 and a first light-emitting element 21 disposed on one side of the base substrate 100. The base substrate 100 may be a rigid substrate, such as a glass substrate, or a flexible substrate, such as a polyimide substrate. The thin film transistor 110 includes an active layer 111, a gate electrode 112, a drain electrode 113 and a source electrode 114. The drain electrode 113 is electrically connected to the second electrode 212 of the first light-emitting element 21, and is configured to drive the first light-emitting element 21 to emit light. The first light-emitting element 21 includes a first electrode 211, a second electrode 212 and a light-emitting layer 213 located between the first electrode 211 and the second electrode 212. The first electrode 211 is a translucent emitting electrode, for example, may be a translucent electrode made of silver or a translucent electrode made of a silver-magnesium alloy. The second electrode 212 is an electrode with variable light transmittance. The second electrode 212 includes a photochromic layer 2121. The photochromic layer 2121 includes a photochromic material and may be switched between a transparent state and an opaque state. When the camera is in a photographing state, the second electrode 212 is in a transparent state to increase the light transmittance of the second display region. When the camera is in a normal display state, the second electrode 212 is in an opaque state and is used to reflect the light emitted from the light-emitting layer 213 to increase the brightness and improve the display effect of the second display region 20.

It should be noted that the first light-emitting element 21 in FIG. 3 is a top-light-emitting structure, and the thin film transistor 110 is a top-gate structure, which is only schematic and does not limit embodiments of the disclosure. In specific implementation, the display panel further includes a buffer layer 101 provided between the base substrate 100 and the active layer 111, multiple insulation layers 102 (two insulation layers are schematically shown in FIG. 3), a planarization layer 103, a pixel defining layer 104 and a multilayer laminated thin film encapsulation layer 105 (three film layers are schematically shown in FIG. 3). In other embodiments, a touch electrode layer and the like may also be included, and specific film layers and positional relationships may be set according to actual needs.

According to the present disclosure, multiple first light-emitting elements are provided in the second display region, the first light-emitting element includes a first electrode, a second electrode and a light-emitting layer located between the first electrode and the second electrode, the second electrode includes a first state and a second state, a light transmittance of the second electrode in the first state is greater than a light transmittance of the second electrode in the second state, and normal display of the second display region can be achieved when the second electrode is in the second state. A direction in which the light-emitting layer points to the first electrode is a light exit direction of the display panel, a photochromic layer is provided in the second electrode, and the photochromic layer may switch between a transparent state and an opaque state to change the light transmittance of the second electrode. In the opaque state, the light sensing element (such as a camera) may be set to be invisible to achieve a full screen effect. At the same time, the light sensing element may be in a transparent state to ensure the normal operation of the light sensing element. When the light sensing element is turned on, the second electrode is in the first state, to facilitate reception of external light by the light sensing element after the external light goes through the display panel and thus improve the imaging quality; when the light sensing element is turned off, the second electrode is in the second state, and the second electrode is a reflective electrode, which improves the light exit efficiency of the first light-emitting element and realizes a full screen display.

In an embodiment, with continued reference to FIG. 1, the first display region 10 includes multiple second light-emitting elements 11; and the arrangement density of the second light-emitting elements 11 of the first display region 10 is greater than the arrangement density of the first light-emitting elements 21 of the second display region 20.

It may be understood that by reducing the arrangement density of the first light-emitting elements 21 in the second display region 20, the area of the transparent region of the second display region 20 may be effectively increased and sufficient light may be transmitted through the transparent region to improve the shooting effect. In other embodiments, the light transmittance of the second display region 20 may be increased by reducing the area of the first light-emitting element 21, and a specific setting manner may be selected according to an actual situation.

In an embodiment, the photochromic material includes at least one of silver halide or silver and cupric oxide. In an embodiment, when the second electrode 212 is switched from the first state to the second state, the silver halide is decomposed into silver and elemental halogen; when the second electrode 212 is switched from the second state to the first state, the silver and the elemental halogen generate the silver halide under catalysis of the cupric oxide.

It may be understood that the silver halide is a transparent material, and the silver halide will decompose under the action of light (for example, the light emitted from the light-emitting layer) to form opaque silver and the elemental halogen. In the absence of light, the elemental halogen and the silver react under the catalysis of the cupric oxide to form transparent silver halide. By using these two conversion processes, the light transmittance of the second electrode 212 can be adjusted. When the camera is in a photographing state, the second electrode 212 is set to the first state, and the photochromic layer 2121 is mainly the silver halide at this time. Therefore, the second electrode 212 has a certain light transmittance, which can improve the light transmittance of the second display region and is beneficial for improvement of the imaging quality. When the camera is in the off state and the display panel is used for normal display, the second electrode 212 is set to the second state. At this time, the second electrode 212 mainly contains silver, and the light transmittance of the second electrode 212 is less than the light transmittance of the first state. Moreover, the silver may be used as a reflective layer to reflect the light emitted from the light-emitting layer 213 to one side of the second electrode 212, and the light exit efficiency of the first light-emitting element 21 is improved and a brightness difference between the first display region and the second display region is avoided. It should be noted that when the camera is turned on and when the camera is turned off, the first light-emitting element 21 of the second display region 20 may be in a light-emitting state or a non-light-emitting state, and the two states are independently controlled and do not need to be turned on or off at the same time, or one is turned on and another is turned off. In the embodiment, the silver halide is selected for the photochromic material. On the one hand, the silver halide has characteristics of high conversion efficiency and high speed; on the other hand, the silver obtained from the silver halide has good conductivity, which can improve the conductivity of the second electrode 212.

It should be noted that, in specific implementation, the light-emitting layer 213 may be an organic light-emitting material, such as a red organic light-emitting material, a green organic light-emitting material and a blue organic light-emitting material. In other embodiments, the first light-emitting element 21 may further include structures such as an electron injection layer, an electron transport layer, a hole injection layer and a hole transport layer, which is not limited in the embodiments of the present disclosure.

According to the present disclosure, multiple first light-emitting elements are provided in the second display region, the first light-emitting element includes a first electrode, a second electrode and a light-emitting layer located between the first electrode and the second electrode, the second electrode includes a first state and a second state, a light transmittance of the second electrode in the first state is greater than a light transmittance of the second electrode in the second state, and normal display of the second display region can be achieved when the second electrode is in the second state. A direction from the light-emitting layer to the first electrode is a light exit direction of the display panel, a photochromic layer is provided in the second electrode, and the photochromic layer may switch between a transparent state and an opaque state to change the light transmittance of the second electrode. In the opaque state, the light sensing element may be set to be invisible to achieve a full screen effect. At the same time, the light sensing element may be in a transparent state to ensure the normal operation of the light sensing element. When the light sensing element (such as a camera) is turned on, the second electrode is in the first state, to facilitate reception of external light by the light sensing element after transmitting the display panel to improve the imaging quality; when the light sensing element is turned off, the second electrode is in the second state, and the second electrode is a reflective electrode, which improves the light exit efficiency of the first light-emitting element and realizes a full screen display.

Figure 4:
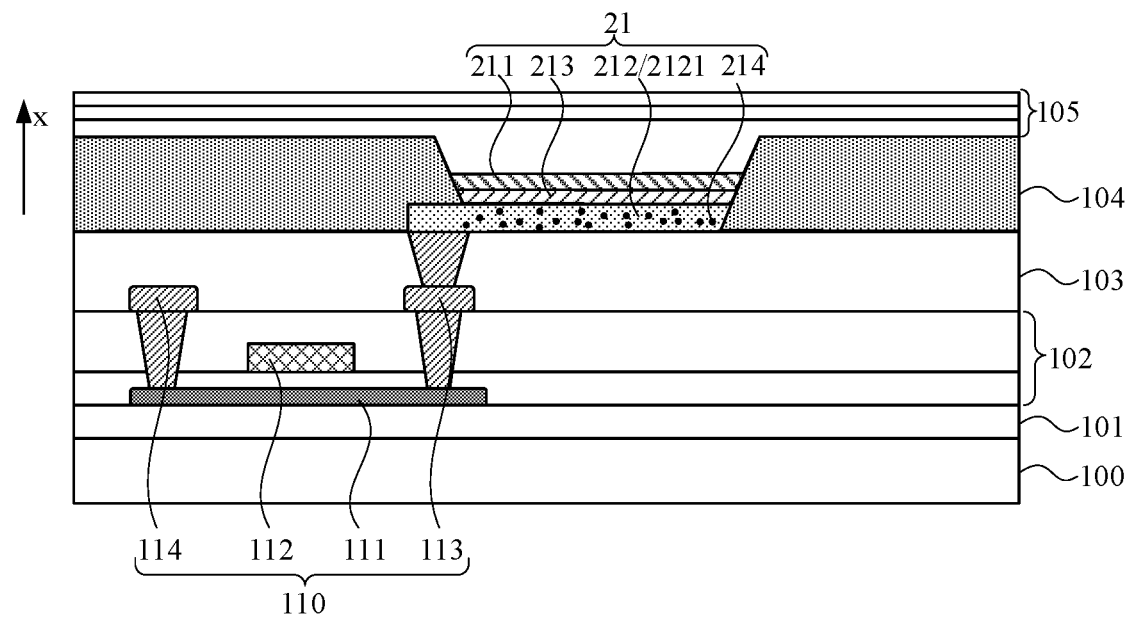
FIG. 4 is another schematic cross-sectional view taken along a line A-A' in FIG. 2.

FIG. 4 is another schematic cross-sectional view taken along a line A-A' in FIG. 2. Referring to FIG. 4, in an embodiment, the photochromic layer 2121 further includes upconverting nanoparticles 214.

It may be understood that upconverting refers to the process of absorbing long-wavelength light and emitting short-wavelength light. The upconverting nanoparticle 214 has the function of absorbing at least two long-wavelength photons and then emitting a short-wavelength photon, for example, absorbing two photons with a wavelength of $\lambda$ and emitting a photon with a wavelength of $\lambda/2$. The shorter the wavelength of light is, the larger energy the light has. By disposing the upconverting nanoparticles 214 in the photochromic layer 2121, the upconverting nanoparticles 214 convert the long-wavelength light into the short-wavelength light. After absorbing the short-wavelength light, the silver halide decomposes faster, that is, the second electrode 212 switches from the first state to the second state faster. Therefore, when the photographing state is switched to the normal display state, the second electrode 212 is quickly switched from the first state to the second state, and the brightness difference between the first display region and the second display region caused by the light transmitted by the second electrode 212 in the normal display state is avoided and the display effect of the display panel is improved.

In specific implementation, the upconverting nanoparticles are doped with rare earth element ions. In an embodiment, the upconverting nanoparticles include at least one of: praseodymium ions, neodymium ions, samarium ions, europium ions, gadolinium ions, terbium ions, holmium ions, erbium ions or thulium ions.

Exemplarily, the upconverting nanoparticles may be erbium and ytterbium co-doped sodium NaYF4 (NaYF4: Yb, Er) nanoparticles, neodymium, thulium and ytterbium co-doped $NaYF_4$ (NaYF4: Yb, Nd, Tm) nanoparticles or thulium and ytterbium co-doped NaYF4 (NaYF4: Yb, Tm) nanoparticles. The specific implementation may be flexibly selected according to actual needs, which is not limited in the embodiment of the present disclosure.

Figure 5:
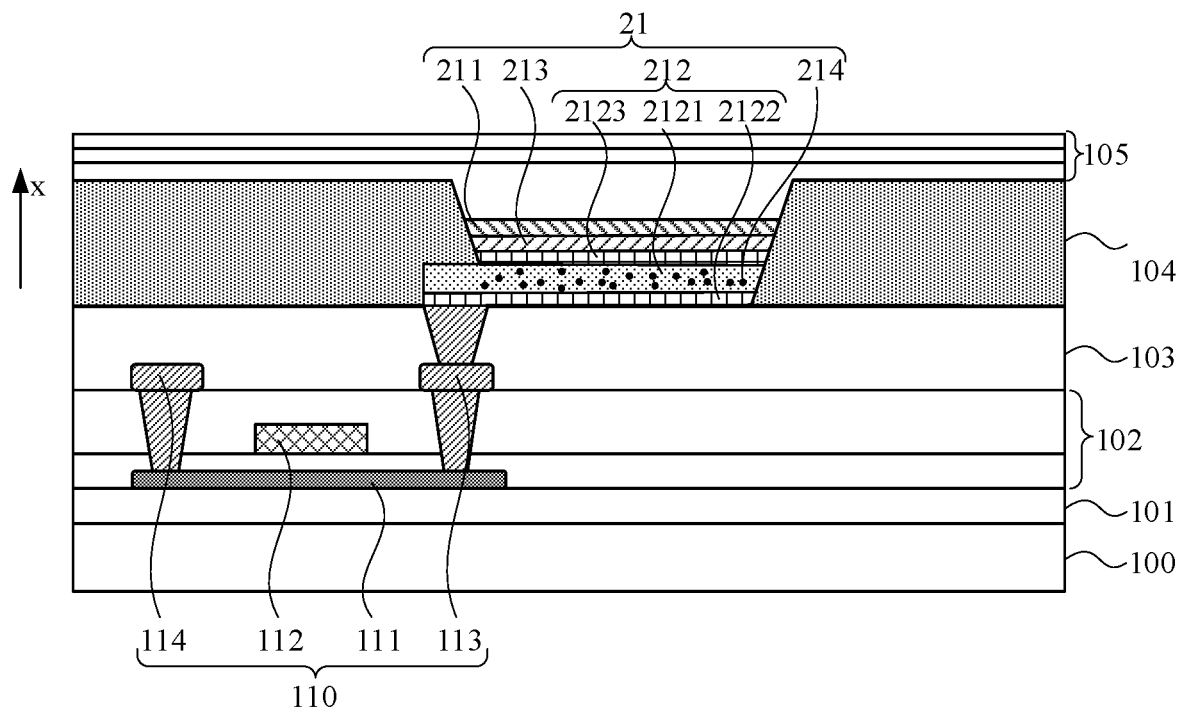
FIG. 5 is another schematic cross-sectional view taken along a line A-A' in FIG. 2.

FIG. 5 is another schematic cross-sectional view taken along a line A-A' in FIG. 2. Referring to FIG. 5, in an embodiment, the second electrode 212 further includes a first transparent conductive layer 2122 and a second transparent conductive layer 2123. The photochromic layer 2121 is located between the first transparent conductive layer 2122 and the second transparent conductive layer 2123. The first transparent conductive layer 2123 is located on a side of the photochromic layer 2121 facing away from the light-emitting layer 213.

It may be understood that the second electrode 212 is a reflective electrode of the first light-emitting element 21, and in order to improve the conductivity of the second electrode 212, the second electrode 212 is further provided with a first transparent conductive layer 2122 and a second transparent conductive layer 2123 located on both sides of the photochromic layer 2121, and the first transparent conductive layer 2122 and the second transparent conductive layer 2123 may both be indium tin oxide (ITO).

Figure 6:
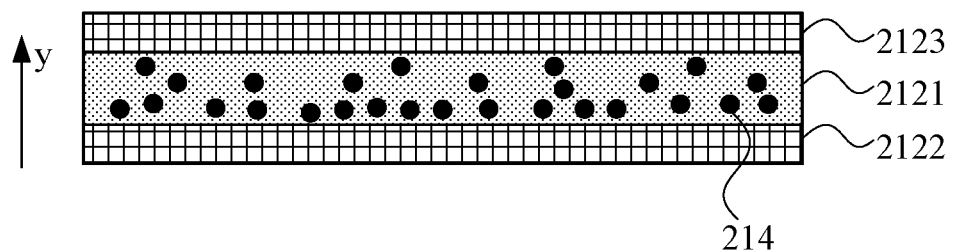
FIG. 6 is a schematic structural diagram of a second electrode according to an embodiment of the present disclosure.

In an embodiment, FIG. 6 is a schematic structural diagram of a second electrode according to an embodiment of the present disclosure. Referring to FIG. 6, in a direction perpendicular to a plane where the display panel is located and from the first transparent conductive layer to the second transparent conductive layer, a concentration of the upconverting nanoparticles in the photochromic layer gradually decreases.

It may be understood that the concentration of the upconverting nanoparticles 214 near the first transparent conductive layer 2122 is large, and the concentration of the upconverting nanoparticles 214 near the second transparent conductive layer 2123 is small. When the second electrode is exposed to light, the silver is deposited faster at the proximity of the first transparent conductive layer 2122, and slower near the second transparent conductive layer 2123, which prevents the photochromic layer 2121 from reacting inadequately due to the rapid decrease in transmittance of the second transparent conductive layer 2123, and prevents the display screen from displaying abnormally due to insufficient reflectivity of the second electrode.

Figure 7:
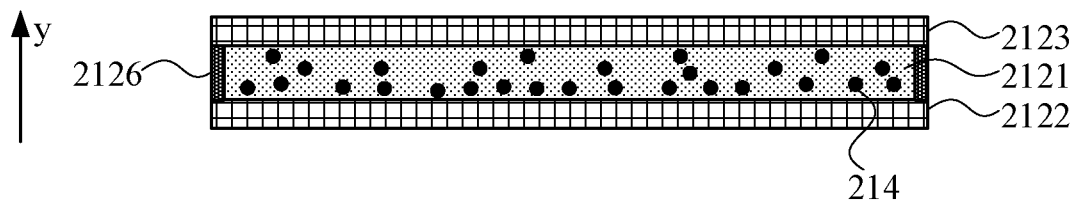
FIG. 7 is a schematic structural diagram of another second electrode according to an embodiment of the present disclosure.

FIG. 7 is a schematic structural diagram of another second electrode according to an embodiment of the present disclosure. Referring to FIG. 7, a silver conductive layer 2126 is provided at the edge of the photochromic layer and connects the first transparent conductive layer 2122 and the second transparent conductive layer 2123, therefore a certain space can be reserved for the intermediate photoconversion layer 2121 to accommodate the photochromic material and the upconverting nanoparticles 214, and the anode potential transmission is ensured and the conductivity of the second electrode is increased.

In an embodiment, the second electrode further includes silver particles doped in the photochromic layer and/or a silver thin film layer, where the silver thin film layer is located on a side of the photochromic layer facing towards the first transparent conductive layer or the second transparent conductive layer.

Figure 8:
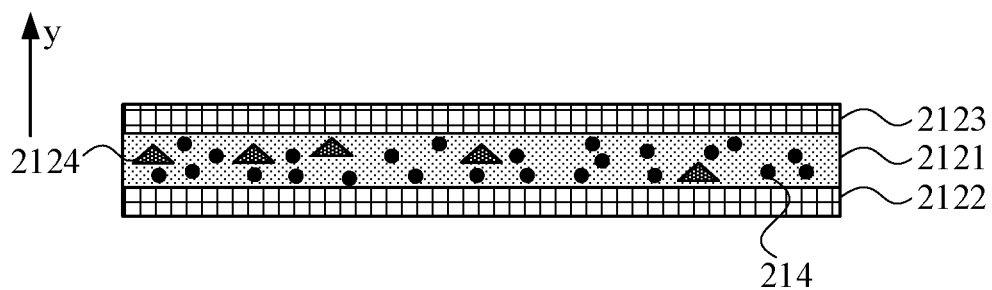
FIGS. 8 to 10 are schematic structural diagrams of another second electrode according to an embodiment of the present disclosure.
Figure 9:
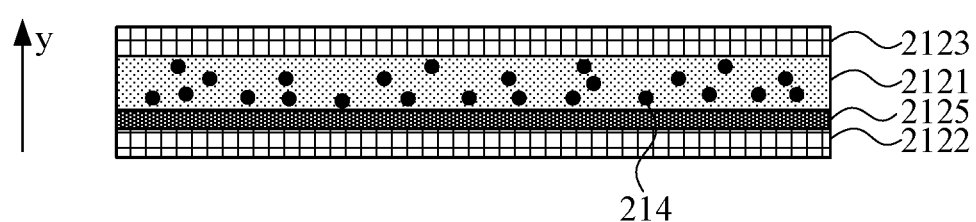
Figure 10:
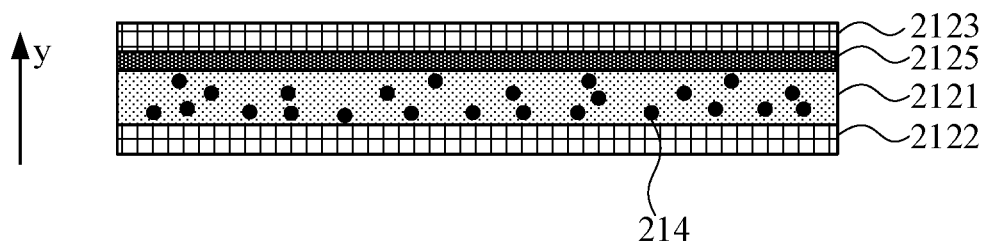

Exemplarily, FIGS. 8 to 10 are schematic structural diagrams of another second electrode in an embodiment of the present disclosure. Referring to FIG. 8, the second electrode further includes silver particles 2124 doped in the photochromic layer 2121. Referring to FIGS. 9 and 10, the second electrode further includes a silver thin film layer 2125 on one side of the photochromic layer 2121. In FIG. 9, the silver thin film layer 2125 is located between the first transparent conductive layer 2122 and the photochromic layer 2121. In FIG. 10, the silver film layer 2125 is located between the second transparent conductive layer 2123 and the photochromic layer 2121. The specific implementation may be flexibly selected according to the actual situation.

It may be understood that when the film layer formed by silver is thin (for example, about 10 nm), the film layer has a certain light transmittance. When the film layer formed by silver is thick, light cannot pass through and the surface is highly reflective. Providing the second electrode 212 with silver particles 2124 or a silver thin film layer 2125 may ensure that the second electrode 212 has good electrical conductivity and a certain light transmittance in the first state, and the working performance of the camera at this time is not affected. In the second state, the silver obtained from the decomposition of the silver halide, together with silver particles 2124 or the silver thin film layer 2125, forms a silver reflection layer, to improve the light transmittance of the second display region when taking a picture and realize a full screen display during normal display.

In an embodiment, the first light-emitting elements include a red light-emitting element, a green light-emitting element and a blue light-emitting element; and the concentration of the upconverting nanoparticles in the second electrode increases in turn for the red light-emitting element, the green light-emitting element and the blue light-emitting element. Exemplarily, for the OLED components of different light-emitting colors, due to the life of the light-emitting materials, the life of the blue light-emitting material is shorter than the life of the green light-emitting material, the life of the green light-emitting material is shorter than the life of the red light-emitting material. The shorter life the light-emitting material has, the faster the brightness decay of the corresponding light-emitting element is. Therefore, the brightness of blue light-emitting elements decay fastest, followed by green light-emitting elements, and red light-emitting elements decay the slowest. Since density of the light-emitting elements in the second display region (camera setting region) is smaller than density of the light-emitting elements in the first display region, the light-emitting elements in the second display region require a larger current to balance the brightness difference between the first display region and the second display region. Increasing the current in the second display region will accelerate the decay rate of all colors, so the brightness decay of the red, green and blue light-emitting elements in the second display region is more obvious, and it is necessary to balance this brightness difference. By means of the arrangement in which the concentration of the upconverting nanoparticles in the second electrode increases in turn for the red light-emitting element, the green light-emitting element and the blue light-emitting element, the reaction in the photochromic layer in the second electrode corresponding to the light-emitting element may be more sufficient, that is, the reflectivity of the second electrode is greater. The concentration of the upconverting nanoparticles in the second electrode increases in turn for the red light-emitting element, the green light-emitting element and the blue light-emitting element, and reflectivity increases in turn for the corresponding light-emitting elements. The brightness of the blue light-emitting element decays quickly. The second electrode corresponding to the blue light-emitting element is set to have a higher reflectivity; for the same light-emitting intensity of a light-emitting element, the higher the reflectivity of the second electrode is, the higher the actual light-emitting brightness of the light-emitting element is, to balance the inconsistent brightness of the light-emitting units of different colors of the display panel caused by the quick brightness decay of the blue light-emitting element due to the short life of the blue light-emitting material, and thus balance uneven brightness decay of light-emitting elements of different colors.

Figure 11:
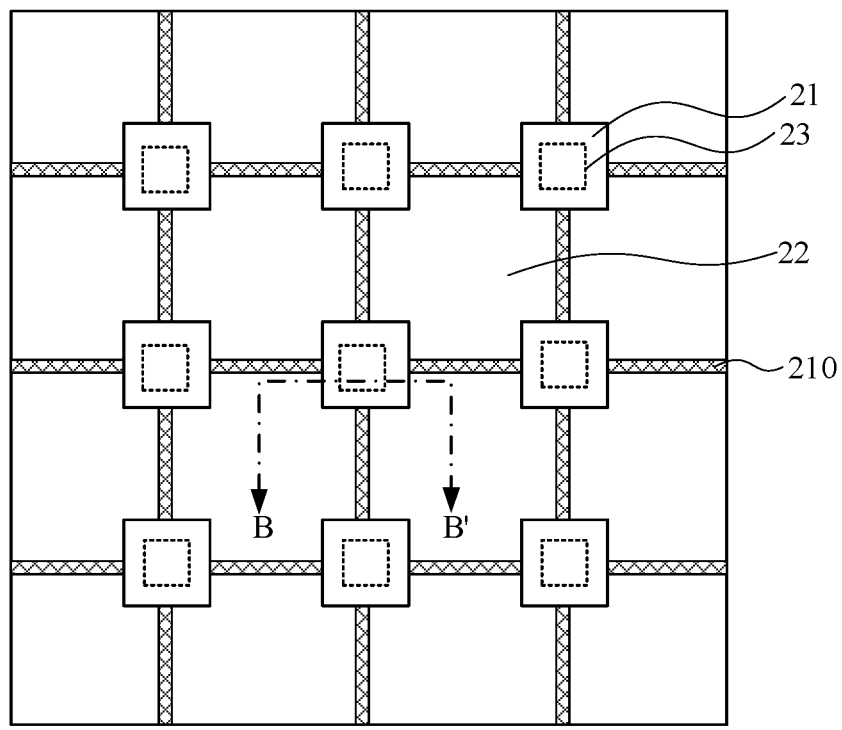
FIG. 11 is a partial schematic structural diagram of another second display region of a display panel according to an embodiment of the present disclosure.
Figure 12:
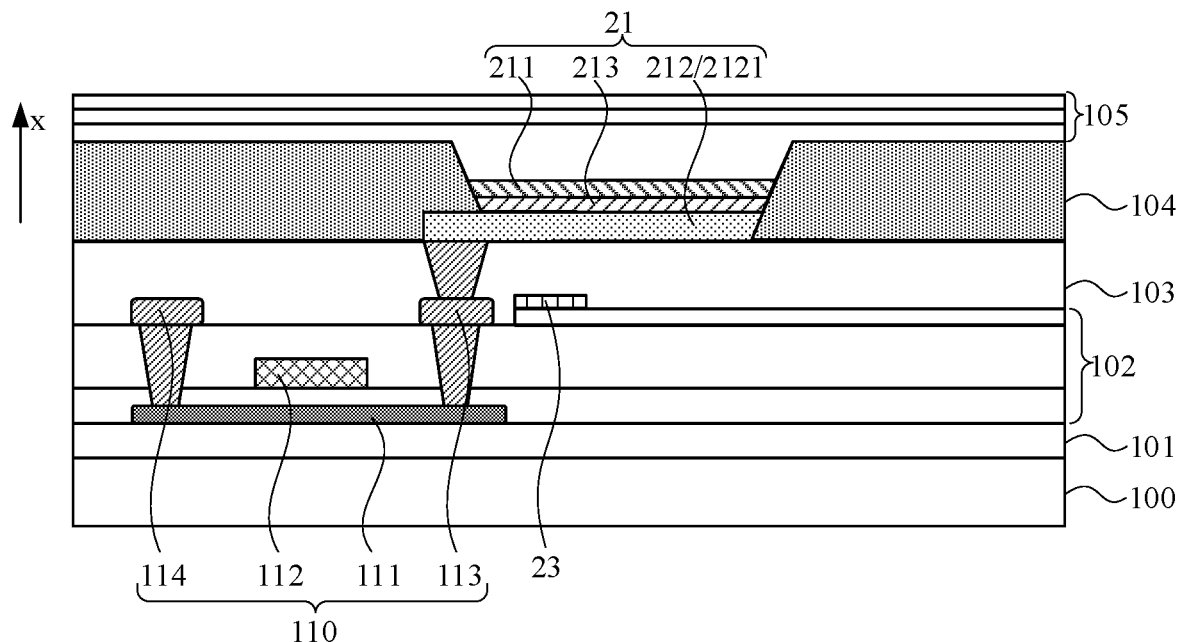
FIG. 12 is a schematic cross-sectional view taken along a line B-B' in FIG. 11.

FIG. 11 is a partial schematic structural diagram of another second display region of a display panel according to an embodiment of the present disclosure, and FIG. 12 is a schematic cross-sectional view taken along a line B-B' in FIG. 11. In an embodiment, the second display region further includes multiple excitation light sources 23; when the excitation light source 23 is in a light-emitting state, the second electrode 212 is switched from the first state to the second state under irradiation of light emitted by the excitation light source 23.

It may be understood that the silver halide in the photochromic layer 2121 may be decomposed under the action of the light emitted from the light-emitting layer 213. In order to accelerate the decomposition process of the silver halide, an excitation light source 23 is also provided in the embodiment. The excitation light source 23 is configured to emit light that can be absorbed by the upconverting nanoparticles and undergoes upconversion, and the second electrode 212 rapidly changes from the first state to the second state. In specific implementation, the excitation light source 23 may be a light source such as a light-emitting diode LED, a micro-LED or a laser diode LD, which is not limited in the embodiment of the present disclosure.

In an embodiment, with continued reference to FIG. 12, the excitation light source 23 is located on a side of the second electrode 212 facing away from the light-emitting layer 213; and the light exit surface of the excitation light source 23 faces towards the photochromic layer 2121. The orthographic projection of the second electrode 212 on a plane where the display panel is located covers an orthographic projection of the excitation light source 23 on the plane where the display panel is located.

It may be understood that the excitation light source 23 is located below the second electrode 212, and the light exit surface of the excitation light source 23 directly faces the photochromic layer 2121 of the second electrode 212. When the excitation light source 23 emits light, the second electrode 212 can quickly switch from the first state to the second state. Further, the concentration of the upconverting nanoparticles is set to sequentially decrease along a direction from the photochromic layer 2121 toward the light-emitting layer 213, to facilitate the upconverting nanoparticles to absorb the light emitted by the excitation light source 23. The excitation light source 23 is disposed below the second electrode 212, and the second electrode 212 is in an opaque state during the display state. The excitation light source 23 does not affect the normal display of the display panel, nor affect the transmittance of the transparent region.

In an embodiment, the excitation light source is an infrared light source. It may be understood that the absorption peak wavelength of rare earth ions is generally in the infrared band, the excitation light source is set as the infrared light source, which has a wavelength matching with the absorption peak of the upconverting nanoparticles, which is beneficial to improve the conversion efficiency and reduce power consumption. For example, for $NaYF_4$: Yb, Er, the excitation wavelength may be 980 nm; for $NaYF_4$: Yb, Nd, Tm, the excitation wavelength may be 795 nm; and for $NaYF_4$: Yb, Tm, the excitation wavelength may be 800 nm. The setting of the excitation light source as an infrared light source may also prevent the light leaked by the excitation light source from affecting the normal display of the display panel. Further, the display panel may further include a fingerprint recognition unit. When the fingerprint recognition unit is selected to be an external type fingerprint recognition light source and its light source is an infrared light source, the display panel may perform biometric recognition. At this time, the infrared fingerprint recognition light source may be reused as the excitation light source in the embodiment without additional excitation source to realize multiple functions of display panel and improve user experience.

Figure 13:
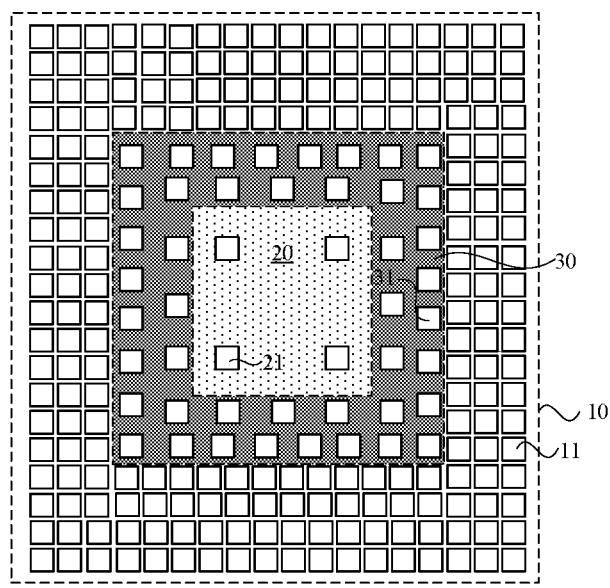
FIG. 13 is a partial schematic structural diagram of another display panel according to an embodiment of the present disclosure.

FIG. 13 is a partial schematic structural diagram of another display panel according to an embodiment of the present disclosure. Referring to FIG. 13, the display panel provided in an embodiment further includes a third display region 30, and the third display region 30 is located between the first display region 10 and the second display region 20. The third display region 30 includes third light-emitting elements 31, the arrangement density of the third light-emitting elements 31 is smaller than the arrangement density of the second light-emitting elements 11 and larger than the arrangement density of the first light-emitting elements 21, and the arrangement density of the third light-emitting elements 31 gradually decreases along a direction from the first display region 10 to the second display region 20.

It may be understood that by setting the third display region 30 between the first display region 10 and the second display region 20 as a transition region, the density of light-emitting elements in the transition region is between the density of light-emitting elements in the first display region 10 and the density of light-emitting elements in the second display region 20, and the light-emitting element density gradually decreases along the direction in which the first display region 10 points to the second display region 20, which can effectively alleviate a bright line generated at the boundary between the first display region 10 and the second display region 20 during normal display, and improve the display effect of the display panel. It should be noted that the light-emitting elements shown in FIG. 13 merely exemplarily show the density of light-emitting elements in different display regions, and are not the actual arrangement positions of the light-emitting elements. In actual implementation, the light-emitting elements are arranged in an array, and the rows and columns of different display regions need to correspond to each other.

Figure 14:
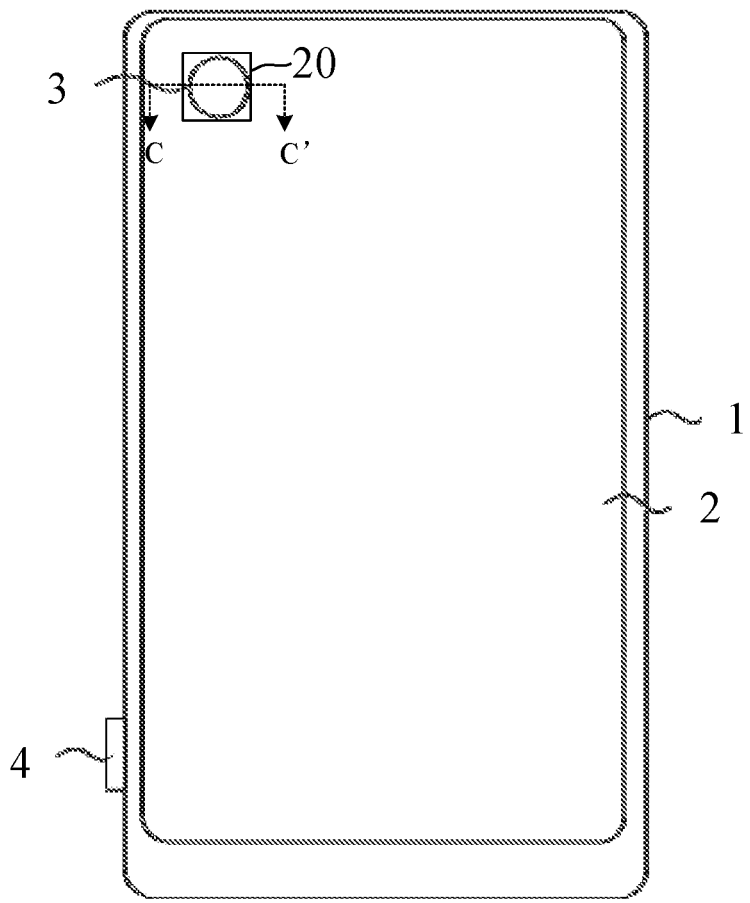
FIG. 14 is a schematic structural diagram of a display device according to an embodiment of the present disclosure.
Figure 15:
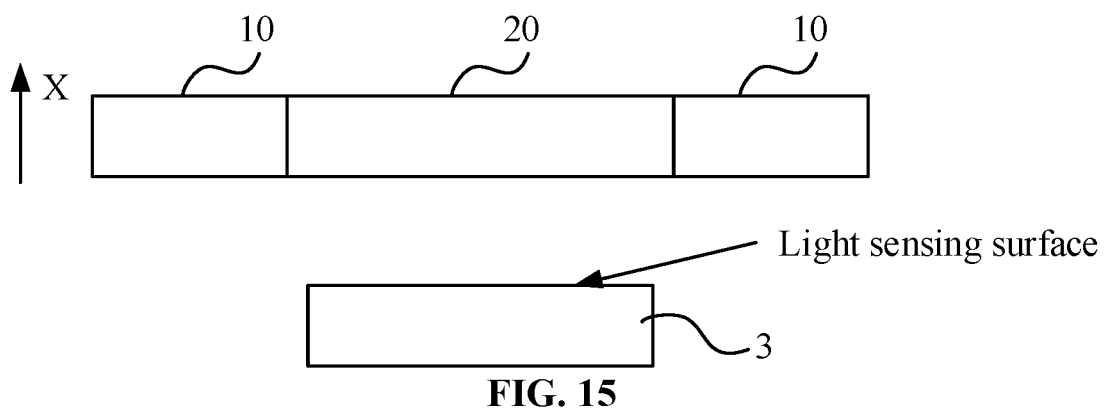
FIG. 15 is a schematic sectional view taken along a line C-C' in FIG. 14.

FIG. 14 is a schematic structural diagram of a display device according to an embodiment of the present disclosure. Referring to FIG. 14, the display device 1 provided in an embodiment includes any one of the display panels 2 provided in the above embodiments, and further includes: a light-sensing element 3, which is disposed in the second display region 20 of the display panel 2. Referring to FIG. 15, the light-sensing element 3 is located on a side of the second electrode 212 facing away from the light exit surface of the display panel 2, and a photosensitive surface of the light sensing element 3 faces the display panel 2. The display device 1 may specifically be a mobile phone, a tablet computer or the like.

In an embodiment, with continued reference to FIG. 14, the display device further includes a mode switch 4. The display device includes a first mode and a second mode. The mode switch 4 is used to switch between the first mode and the second mode of the display device. In the first mode, the light sensing element is in an on state and the second electrode is in a first state; and in the second mode, the light sensing element is in an off state and the second electrode is in a second state.

It may be understood that the sensing element 3 may be a camera. The first mode is a photographing mode and the second mode is a normal display mode. Since the display device provided by the embodiment of the present disclosure includes any one of the display panels provided by the above embodiments, it has the same and corresponding effects.

What is claimed is:
1. A display panel, comprising:
a first display region and a second display region adjacent to the first display region;
wherein the second display region comprises a plurality of first light-emitting elements, and each of the plurality of first light-emitting elements comprises a first electrode, a second electrode and a light-emitting layer located between the first electrode and the second electrode;
wherein a direction from the light-emitting layer to the first electrode is a light exit direction of the display panel, the second electrode comprises a photochromic layer, and the photochromic layer comprises a photochromic material;
wherein the second electrode comprises a first state and a second state, and a light transmittance of the second electrode in the first state is greater than a light transmittance of the second electrode in the second state, wherein the second electrode is in the first state, external light incident from a direction opposite to the light exit direction is allowed to pass through the second electrode;
wherein the photochromic layer further comprises upconverting nanoparticles;
wherein the second electrode further comprises a first transparent conductive layer and a second transparent conductive layer, the photochromic layer is located between the first transparent conductive layer and the second transparent conductive layer, and the first transparent conductive layer is located on a side of the photochromic layer facing away from the light-emitting layer; and wherein in a direction perpendicular to a plane where the display panel is located and from the first transparent conductive layer to the second transparent conductive layer, a concentration of the upconverting nanoparticles in the photochromic layer gradually decreases.

2. The display panel of claim 1, wherein the photochromic material comprises cupric oxide and at least one of silver halide or silver.

3. The display panel of claim 2, wherein in a case where the second electrode transitions from the first state to the second state, the silver halide is decomposed into silver and elemental halogen; and wherein in a case where the second electrode transitions from the second state to the first state, the silver and the elemental halogen generate the silver halide under catalysis of the cupric oxide.

4. The display panel of claim 1, wherein the upconverting nanoparticles comprise at least one of: praseodymium ions, neodymium ions, samarium ions, europium ions, gadolinium ions, terbium ions, holmium ions, erbium ions, or thulium ions.

5. The display panel of claim 1, wherein the second electrode further comprises silver particles doped in the photochromic layer and/or a silver thin film layer, wherein the silver thin film layer is located on a side of the photochromic layer facing towards the first transparent conductive layer or the second transparent conductive layer.

6. The display panel of claim 1, wherein the plurality of first light-emitting elements comprise a red light-emitting element, a green light-emitting element, and a blue light-emitting element; and wherein a concentration of the upconverting nanoparticles in the second electrode increases in turn for the red light-emitting element, the green light-emitting element and the blue light-emitting element.

7. The display panel of claim 1, wherein the second display region further comprises a plurality of excitation light sources;

wherein in a case where the plurality of excitation light sources are in a light-emitting state, the second electrode transitions from the first state to the second state under irradiation of light emitted by the plurality of excitation light sources.

8. The display panel of claim 7, wherein the plurality of excitation light sources is located on a side of the second electrode facing away from the light-emitting layer; and a light exit surface of each of the plurality of excitation light sources faces towards the photochromic layer;

wherein an orthographic projection of the second electrode on a plane where the display panel is located covers an orthographic projection of the plurality of excitation light sources on the plane where the display panel is located.

9. The display panel of claim 7, wherein each of the plurality of excitation light sources is an infrared light source.

10. The display panel of claim 1, wherein the first display region comprises a plurality of second light-emitting elements;

wherein arrangement density of the plurality of second light-emitting elements in the first display region is greater than arrangement density of the plurality of first light-emitting elements in the second display region.

11. The display panel of claim 10, further comprising a third display region, wherein the third display region is located between the first display region and the second display region;

wherein the third display region comprises a plurality of third light-emitting elements, arrangement density of the plurality of third light-emitting elements is smaller than the arrangement density of the plurality of second light-emitting elements and is greater than the arrangement density of the plurality of first light-emitting elements, and the arrangement density of the plurality of third light-emitting elements gradually decreases along a direction from the first display region to the second display region.

12. A display device, comprising:

a display panel, wherein the display panel comprises a first display region and a second display region adjacent to the first display region;

wherein the second display region comprises a plurality of first light-emitting elements, and each of the plurality of first light-emitting elements comprises a first electrode, a second electrode and a light-emitting layer located between the first electrode and the second electrode;

wherein a direction from the light-emitting layer to the first electrode is a light exit direction of the display panel, the second electrode comprises a photochromic layer, and the photochromic layer comprises a photochromic material;

wherein the second electrode comprises a first state and a second state, and a light transmittance of the second electrode in the first state is greater than a light transmittance of the second electrode in the second state, wherein the second electrode is in the first state, external light incident from a direction opposite to the light exit direction is allowed to pass through the second electrode;

wherein the photochromic layer further comprises upconverting nanoparticles;

wherein the second electrode further comprises a first transparent conductive layer and a second transparent conductive layer, the photochromic layer is located between the first transparent conductive layer and the second transparent conductive layer, and the first transparent conductive layer is located on a side of the photochromic layer facing away from the light-emitting layer;

wherein in a direction perpendicular to a plane where the display panel is located and from the first transparent conductive layer to the second transparent conductive layer, a concentration of the upconverting nanoparticles in the photochromic layer gradually decreases; and wherein the display device further comprises:

a light sensing element, wherein the light sensing element is disposed in the second display region of the display panel and is located on a side of the second electrode facing away from a light exit surface of the display panel, and a light sensing surface of the light sensing element faces towards the display panel so that the external light passing through the second electrode is allowed to be received by the light sensing element.

13. The display device of claim 12, further comprising a mode switch, wherein the display device comprises a first mode and a second mode, the mode switch is configured to switch between the first mode and the second mode of the display device, wherein in the first mode, the light sensing element is in an on state, and the second electrode is in the first state; and in the second mode, the light sensing element is in an off state, and the second electrode is in the second state.

* * * * *